United States Patent
Tran et al.

(10) Patent No.: US 6,801,451 B2
(45) Date of Patent: Oct. 5, 2004

(54) MAGNETIC MEMORY DEVICES HAVING MULTIPLE BITS PER MEMORY CELL

(75) Inventors: Lung T. Tran, Saratoga, CA (US); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 33 days.

(21) Appl. No.: 10/235,045

(22) Filed: Sep. 3, 2002

(65) Prior Publication Data

US 2004/0042264 A1 Mar. 4, 2004

(51) Int. Cl.[7] .................................................. G11C 11/00
(52) U.S. Cl. ..................... 365/158; 365/173; 365/225.5; 365/66; 257/295
(58) Field of Search .................................. 365/158, 173, 365/225.5, 66, 157, 171; 257/295, 421

(56) References Cited

U.S. PATENT DOCUMENTS

| | | | |
|---|---|---|---|
| 5,703,805 A | 12/1997 | Tehrani et al. | 365/173 |
| 5,930,164 A | 7/1999 | Zhu | 365/158 |
| 6,404,674 B1 * | 6/2002 | Anthony et al. | 365/173 |
| 6,549,455 B2 * | 4/2003 | Yamada | 365/158 |
| 6,593,608 B1 | 7/2003 | Sharma et al. | 257/295 |
| 2004/0008557 A1 * | 1/2004 | Perner et al. | 365/211 |

* cited by examiner

*Primary Examiner*—Richard Elms
*Assistant Examiner*—N. Nguyen

(57) ABSTRACT

A memory cell of a data storage device includes serially-connected first and second magnetoresistive devices. The first magnetoresistive device has first and second resistance states. The second magnetoresistive device has third and fourth resistance states. The four resistance states are detectably different.

24 Claims, 6 Drawing Sheets

MAGNETIC MEMORY DEVICES HAVING MULTIPLE BITS PER MEMORY CELL

BACKGROUND

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

Increasing bit density in MRAM devices is highly desirable. An increase in bit density can increase storage capacity and reduce storage cost.

DETAILED DESCRIPTION

Figure 1:
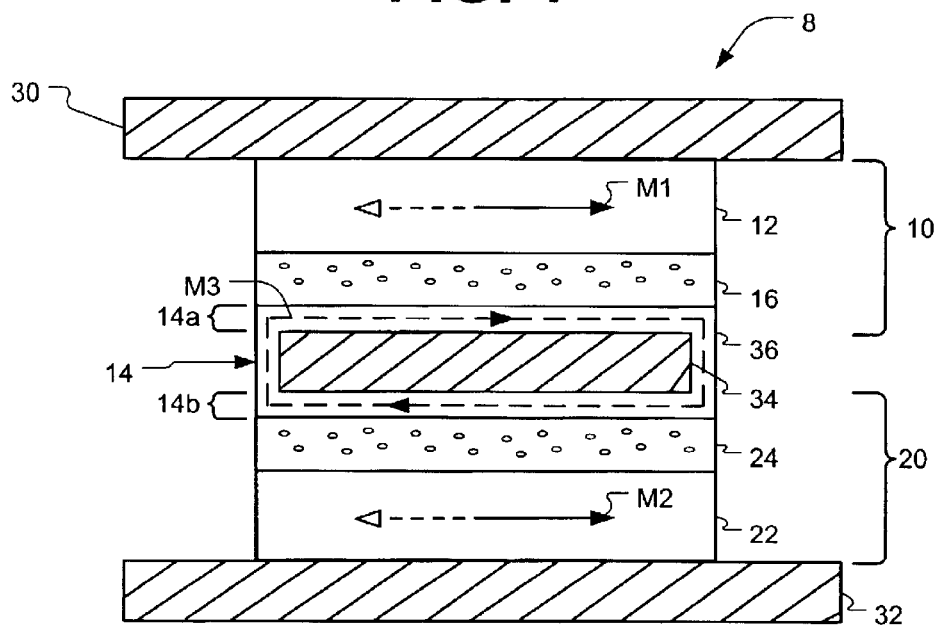
FIG. 1 is an illustration of a magnetic memory device according to a first embodiment of the present invention.

Reference is made to FIG. 1, which illustrates a magnetic memory device 8 including first and second magnetic tunnel junctions 10 and 20. The first magnetic tunnel junction 10 includes a first data layer 12, an upper portion 14a of a reference layer 14, and a first insulating tunnel barrier 16 between the data layer 12 and the upper portion 14a. The first data layer 12 is made of a ferromagnetic material and has a magnetization (represented by the vector M1) that can be oriented in either of two directions, typically along its easy axis (one direction is shown in solid, and the other direction is shown in dashed). The upper portion 14a of the reference layer 14 is also made of a ferromagnetic material and has a magnetization (represented by the vector M3) that can be oriented in either of two directions, typically along its easy axis. The easy axes of the first data layer 12 and the upper portion 14a of the reference layer 14 extend in the same direction.

Figure 1A:
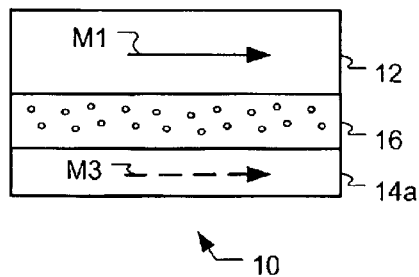
FIGS. 1a and 1b are illustrations of different magnetization orientations of the magnetic memory device.
Figure 1B:
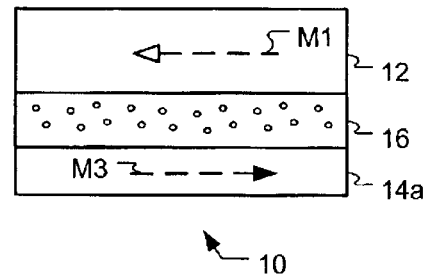

If the magnetizations vectors (M1 and M3) of the first data layer 12 and the upper portion 14a of the reference layer 14 are pointing in the same direction, the orientation of the first magnetic tunnel junction 10 is said to be "parallel" (see FIG. 1a). If the magnetization vectors (M1 and M3) of the first data layer 12 and the upper portion 14a of the reference layer 14 are pointing in opposite directions, the orientation of the first magnetic tunnel junction 10 is said to be "anti-parallel" (see FIG. 1b). These two stable orientations, parallel and anti-parallel, may correspond to logic values of '0' and '1.'

The first insulating tunnel barrier 16 allows quantum mechanical tunneling to occur between the first data layer 12 and the upper portion 14a of the reference layer 14. This tunneling phenomenon is electron spin dependent, causing the resistance of the first magnetic tunnel junction 10 to be a function of the relative orientations of the magnetization vectors (M1 and M3) of the first data layer 12 and the upper portion 14a of the reference layer 14. For instance, resistance of the first magnetic tunnel junction 10 is a first value (R) if the magnetization orientation of the magnetic tunnel junction 10 is parallel and a second value (R1+ΔR1) if the magnetization orientation is anti-parallel. The first insulating tunnel barrier 16 may be made of aluminum oxide ($Al_2O_3$), silicon dioxide ($SiO_2$), tantalum oxide ($Ta_2O_5$), silicon nitride ($Si_3N_4$), aluminum nitride (AlN), or magnesium oxide (MgO). Other dielectrics and certain semiconductor materials may be used for the first insulating tunnel barrier 16. Thickness of the insulating tunnel barrier 16 may range from about 0.5 nanometers to about three nanometers.

The second magnetic tunnel junction 20 includes a second data layer 22, a lower portion 14b of the reference layer 14, and a second insulating tunnel barrier 24 between the second data layer 22 and the lower portion 14b. The second data layer 22 is made of a ferromagnetic material and has a magnetization (represented by the vector M2) that can be oriented in either of two directions, typically along its easy axis. The lower portion 14b of the reference layer 14 is also made of a ferromagnetic material, and has a magnetization (represented by the same vector M3) that can be oriented in either of two directions, typically along its easy axis. The second insulating tunnel barrier 24 allows quantum mechanical tunneling to occur between the second data layer 22 and the reference layer 14. Resistance of the second magnetic tunnel junction 20 is a function of the relative orientations of the magnetization vectors (M2 and M3) of the second data layer 12 and the lower portion of the reference layer 14.

The first magnetic tunnel junction 10 has two resistance states (R1, R1+ΔR1), and the second magnetic tunnel junction 20 has two resistance states (R2, R2+ΔR2). The resistance of the magnetic tunnel junctions 10 and 20 may be made different by using different thickness and/or materials for the insulating tunnel barriers 16 and 24. As long as is the four resistance states are detectably different, four different logic levels can be stored in the magnetic memory device 8.

A first electrical conductor 30 is in contact with the first data layer 12, and a second electrical conductor 32 is in contact with the second data layer 22. The reference layer 14 includes a third conductor 34. The conductors 30, 32 and 34 may be made of a material such as copper or aluminum. The first and second conductors 30 and 32 extend in the same direction. The third conductor 34 is roughly orthogonal to the first and second conductors 30 and 32.

The reference layer 14 further includes a ferromagnetic cladding 36 on the third conductor 34. The upper portion 14a of the reference layer 14 includes that part of the cladding 36 between third conductor 34 and the first insulating tunnel barrier 16. The lower portion 14b of the reference layer includes that part of the cladding 36 between the third conductor 34 and the second insulating tunnel barrier 24. The depiction of the cladding thickness relative to the third conductor 34 is exaggerated. The thickness of the cladding 36 may be about 1 nm to 50 nm (with a typical value of 4 nm). Supplying a current to the third conductor 34 causes a magnetic field to be generated about the third conductor 34. If the current flows into the third conductor 34, the magnetic field causes the reference layer magnetization vector (M3) to point to in a clockwise direction about the third conductor 34 (as shown in FIG. 1). If the current flows in the opposite direction, the magnetic field causes the reference layer magnetization vector (M3) to point in a counter-clockwise direction about the third conductor 34. The magnetization points in one direction in the upper portion 14a and points in an opposite direction in the lower portion 14b. The cladding 36 provides a conductive path for the magnetic field.

Figure 2:
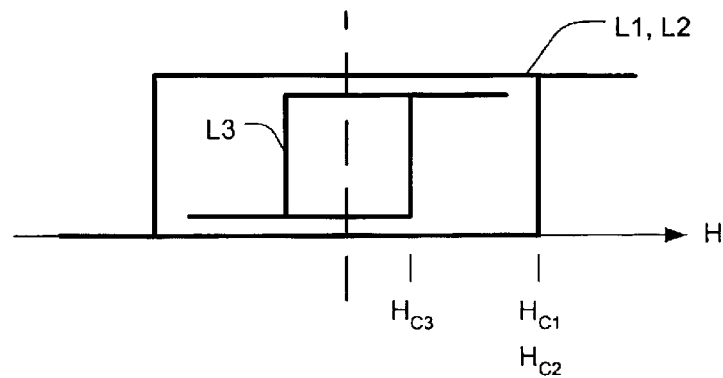
FIG. 2 is an illustration of hysteresis loops for data and reference layers of the magnetic memory device.

Additional reference is now made to FIG. 2, which shows hysteresis loops L1 and L2 for the first and second data layers 12 and 22. FIG. 2 also shows a hysteresis loop L3 for the upper and lower portions 14a and 14b of the reference layer 14. The first and second data layers 12 and 22 may have the same coercivity. That is, $H_{C1}=H_{C2}$. Coercivity ($H_{C1}$, $H_{C2}$) of the data layers 12 and 22 is much higher than coercivity ($H_{C3}$) of the reference layer portions 14a and 14b. The data layer coercivity ($H_{C1}$, $H_{C2}$) may be at least 2–5 times greater than the coercivity ($H_{C3}$) of the reference layer portions 14a and 14b. For example, the data layer coercivity ($H_{C1}$, $H_{C2}$) may be about 25 Oe, and the coercivity ($H_{C3}$) of each reference layer portion 14a and 14b may be about 5 Oe. Thus the reference layer portions 14a and 14b are considered "softer" than the data layers 12 and 22 because the reference layer magnetization vector (M3) is much easier to flip. It is preferred to make the coercivity ($H_{C3}$) of the reference layer portions 14a and 14b as low as possible.

Coercivities may be made different by using different bit shapes, geometries, compositions, thickness, etc. Ferromagnetic layer materials include nickel iron (NiFe), nickel iron cobalt (NiFeCo), cobalt iron (CoFe), other magnetically soft alloys of NiFe and Co, doped amorphous ferromagnetic alloys, and PERMALLOY™. For example, the data layers 12 and 22 may be made of NiFeCo or CoFe, and the cladding 36 may be made of NiFe.

Figure 3:
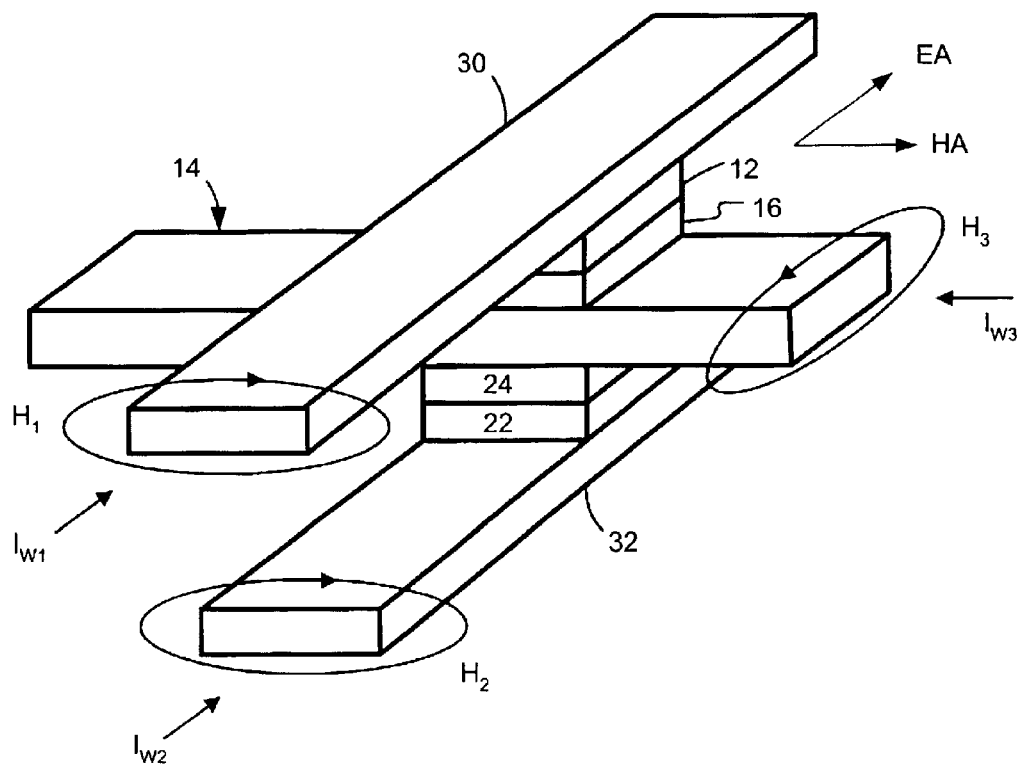
FIG. 3 is an illustration of a write operation on the magnetic memory device.

Reference is now made to FIG. 3. Write operations may be performed by supplying first, second and third write currents ($I_{W1}$, $I_{W2}$, $I_{W3}$) to the first, second, and third conductors 30, 32, and 34. The first, second, and third write currents ($I_{W1}$, $I_{W2}$, $I_{W3}$) create first, second and third magnetic fields ($H_1$, $H_2$, $H_3$) about the first, second and third conductors 30, 32 and 34, respectively. The first and third magnetic fields ($H_1$ and $H_3$), when combined, exceed the coercivity ($H_{C1}$) of the first data layer 12 and, therefore, cause the magnetization vector (M1) of the first data layer 12 to be set in a desired orientation. The orientation of the first data layer magnetization vector (M1) determines the logic value stored in the first magnetic tunnel junction 10. The second and third magnetic fields ($H_2$ and $H_3$), when combined, exceed the coercivity ($H_{C2}$) of the second data layer 22 and, therefore, cause the magnetization vector (M2) of the second data layer 22 to be set in a desired orientation. The orientation of the second data layer magnetization vector (M2) determines the logic value stored in the second magnetic tunnel junction 20.

The orientation of the first data layer magnetization vector (M1) may be set independently of the orientation of the second data layer magnetization vector (M2). Thus the combination of the first and third write currents ($I_{W1}$ and $I_{W3}$) may be applied independently of the combination of the second and third write currents ($I_{W2}$ and $I_{W3}$).

The first and second magnetic tunnel junctions 10 and 20 may be written to sequentially. For example, either the first and second write currents ($I_{W1}$ or $I_{W2}$) is supplied to the first or second conductor 30 or 32, and the third write current ($I_{W3}$) is supplied to the third conductor 34 with a small delay (e.g., 20 ns). As a result, the hard axis field is applied first to take advantage of the higher torque it creates on the magnetization vectors (M1 and M2) aligned along the easy axis (the easy axis and the hard axis are indicated by arrows labeled EA and HA).

If the magnitudes of all three write currents are equal, the magnetic fields about the first and second conductors 30 and 32 will have a greater influence on the data layers 12 and 22 than the magnetic field about the third conductor 34 (because part of the magnetic field saturates the ferromagnetic cladding 36). The magnitude of the third write current ($I_{W3}$) can be made greater than the magnitude of the first and second write currents ($I_{W1}$, $I_{W2}$) in order to compensate for the saturation of the ferromagnetic cladding 36 and to produce a higher torque on the magnetization vectors (M1 and M2).

Figure 4:
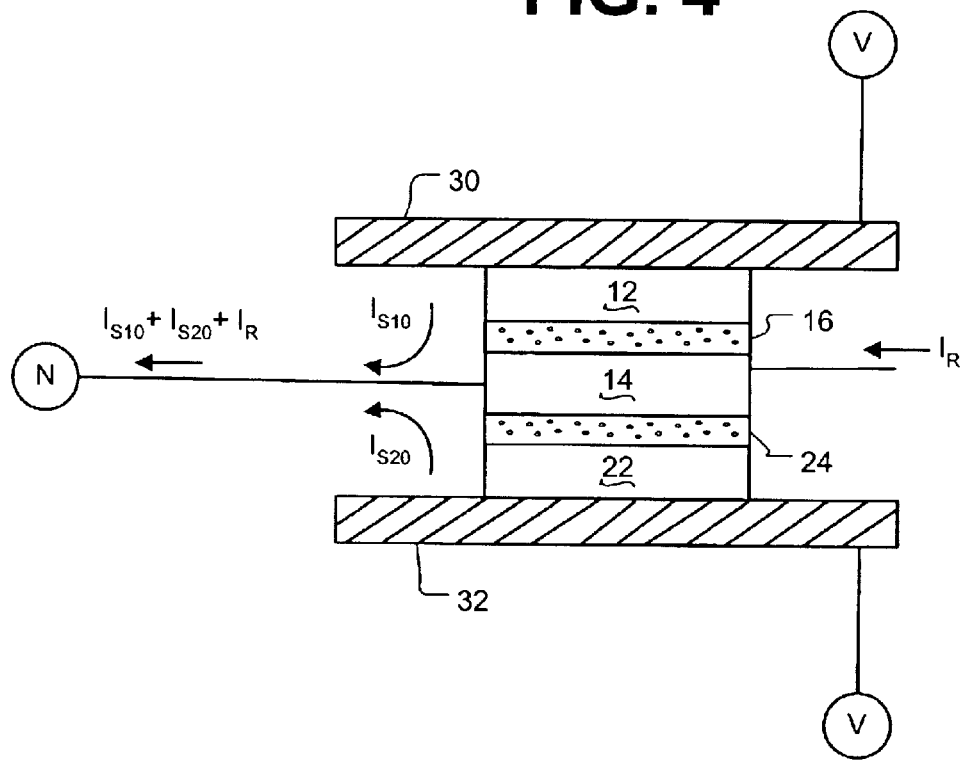
FIG. 4 is an illustration of a read operation on the magnetic memory device.

Reference is now made to FIG. 4, which illustrates a read operation. A read current ($I_R$) is supplied to the third conductor 34. The read current ($I_R$) causes a magnetic field to be generated about the third conductor 34. The magnetic field causes the magnetization in the upper portion 14a of the reference layer 14 to point in an opposite direction to the magnetization in the lower portion 14b of the reference layer 14. Since the coercivity ($Hc_3$) of the reference layer 14 is low, the magnitude of the read current ($I_R$) can be low. Thus the resulting magnetic field does not affect the magnetization of the data layers 12 and 22.

A first potential (V) is applied to the first and second conductors 30 and 32, and the third conductor 34 is maintained at a potential that is lower than the first potential. As a result, a first sense current ($I_{S10}$) flows through the first magnetic tunnel junction 10 and into a node (N), and a second sense current ($I_{S20}$) flows through the second magnetic tunnel junction 10 and into the node (N). Measuring the sum of the currents ($I_{S10}+I_{S20}+I_R$) flowing into the node (N) allows the resistance state of the device 8 to be inferred. The inferred resistance state will be R1+R2, R1+R2+ΔR1, R1+R2+ΔR2, or R1+R2+ΔR1+ΔR2. As long as the four resistance states are detectably different, four different logic levels can be read.

Figure 5:
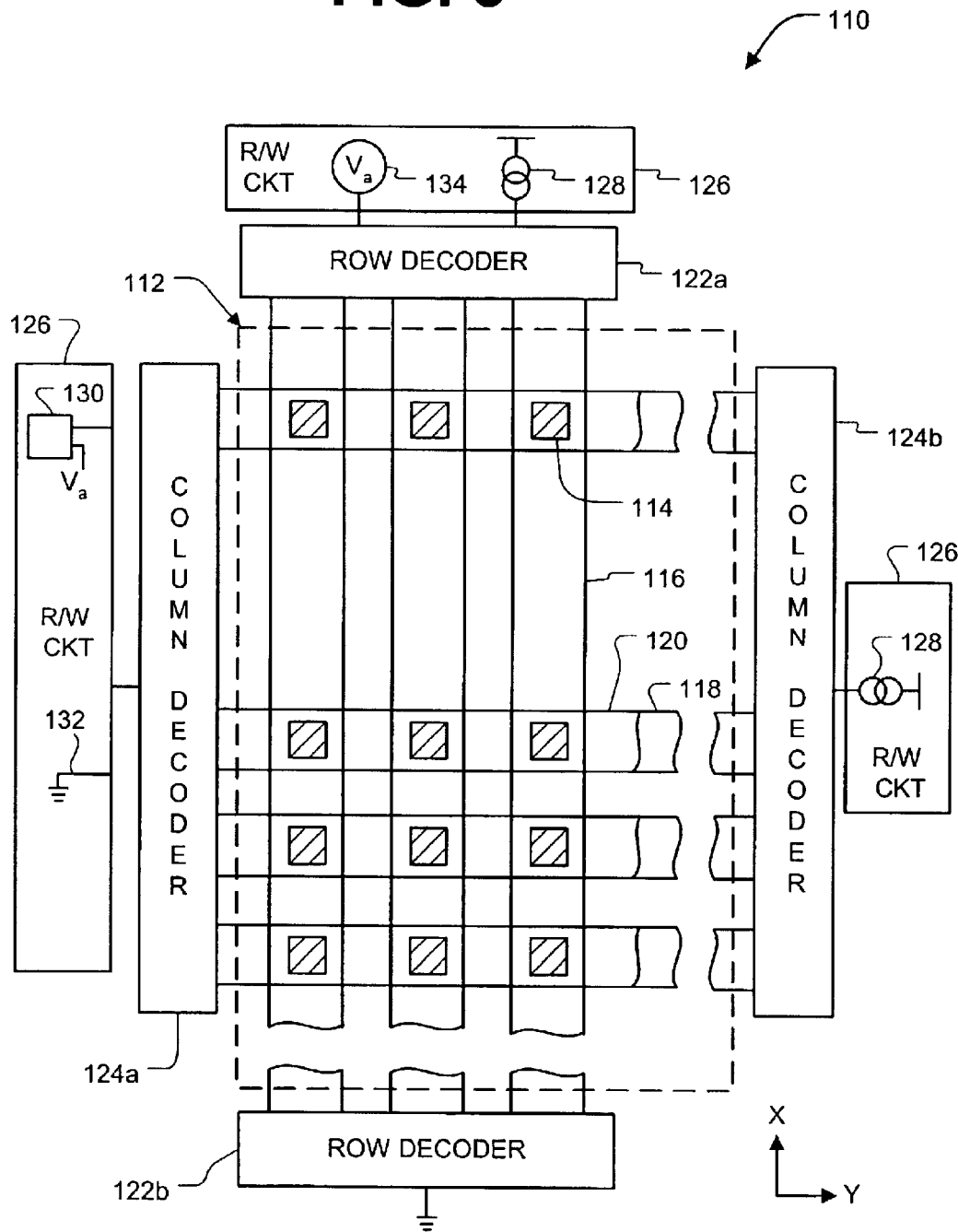
FIG. 5 is an illustration of an MRAM device according to an embodiment of the present invention.

Reference is now made to FIG. 5, which illustrates an MRAM device 110. The MRAM device 110 includes an array 112 of memory cells 114. Each memory cell 114 includes first and second magnetic tunnel junctions 10 and 12. The memory cells 114 are arranged in rows and columns, with the rows extending along an x-direction and the columns extending along a y-direction. Only a relatively small number of the memory cells 114 is shown to simplify the illustration of the MRAM device 110. In practice, arrays of any size may be used.

Word lines 116 extend along the x-direction. Each word line 116 includes a third conductor 34 that is clad with ferromagnetic material 36. Each word line 116 is in contact with a row of first insulating tunnel barriers 16 (of first magnetic tunnel junctions 10) and a row of second insulating tunnel barriers 24 (of second magnetic tunnel junctions 20). First and second bit lines 118 and 120 extend along the y-direction. Each first bit line 118 is in contact with a column of first data layers 12 (of first magnetic tunnel junctions 10). Each first magnetic tunnel junction 10 is located at a cross point of a word line 116 and a first bit line 118. Each second bit line 120 is in contact with a column of second data layers 22 (of second magnetic tunnel junctions 20). Each second magnetic tunnel junction 20 is located at a cross point of a word line 116 and a second bit line 120.

The MRAM device 110 further includes first and second row decoders 122a and 122b, first and second column decoders 124a and 124b, and a read/write circuit 126. The decoders 122a, 122b, 124a and 124b select word and bit lines 116, 118 and 120 during read and write operations. A selected first magnetic tunnel junction 10 lies at the cross point of a selected word line 116 and a selected first bit line 118. A selected second magnetic tunnel junction 20 lies at the cross point of a selected word line 116 and a selected second bit line 120.

The read/write circuit 126 includes current sources 128 for supplying write currents to selected word and bit lines 116, 118 and 120 during write operations. The current sources 128 also supply the read currents during read operations. The read/write circuit 126 includes sense amplifiers 130, ground connections 132, and a voltage source 134 for applying voltages during read operations.

During a write operation, the read/write circuit 126 writes logic values to the first and second magnetic tunnel junctions 10 and 20 of a selected memory cell 114.

During a read operation, the read/write circuit 126 senses the resistance states of the first and second magnetic tunnel junctions 10 and 20 of a selected memory cell 114. In the array 112, however, the magnetic tunnel junctions 10 and 20 are coupled together through many parallel paths. The resistance seen at one cross point equals the resistance of the magnetic tunnel junction 10 at that cross point in parallel with resistances of magnetic tunnel junctions 10 and 20 in the other rows and columns and the magnetic tunnel junctions. Thus the array 112 of magnetic tunnel junctions 10 may be characterized as a two-level cross point resistor network.

Because the magnetic tunnel junctions 10 and 20 are connected as a cross point resistor network, parasitic or sneak path currents can interfere with the read operations on selected magnetic tunnel junctions 10 and 20. Blocking devices such as diodes or transistors may be connected to the magnetic tunnel junctions 10 and 20. These blocking devices can block the parasitic currents.

In the alternative, the parasitic currents may be dealt with by using a variation of an "equipotential" method disclosed in assignee's U.S. Pat. No. 6,259,644. The equipotential method disclosed in U.S. Pat. No. 6,259,644 involves applying a potential to a selected line, and providing the same potential to a subset of unselected bit lines and unselected word lines. The parasitic currents are shunted so as not to interfere with the sense currents.

Figure 6A:
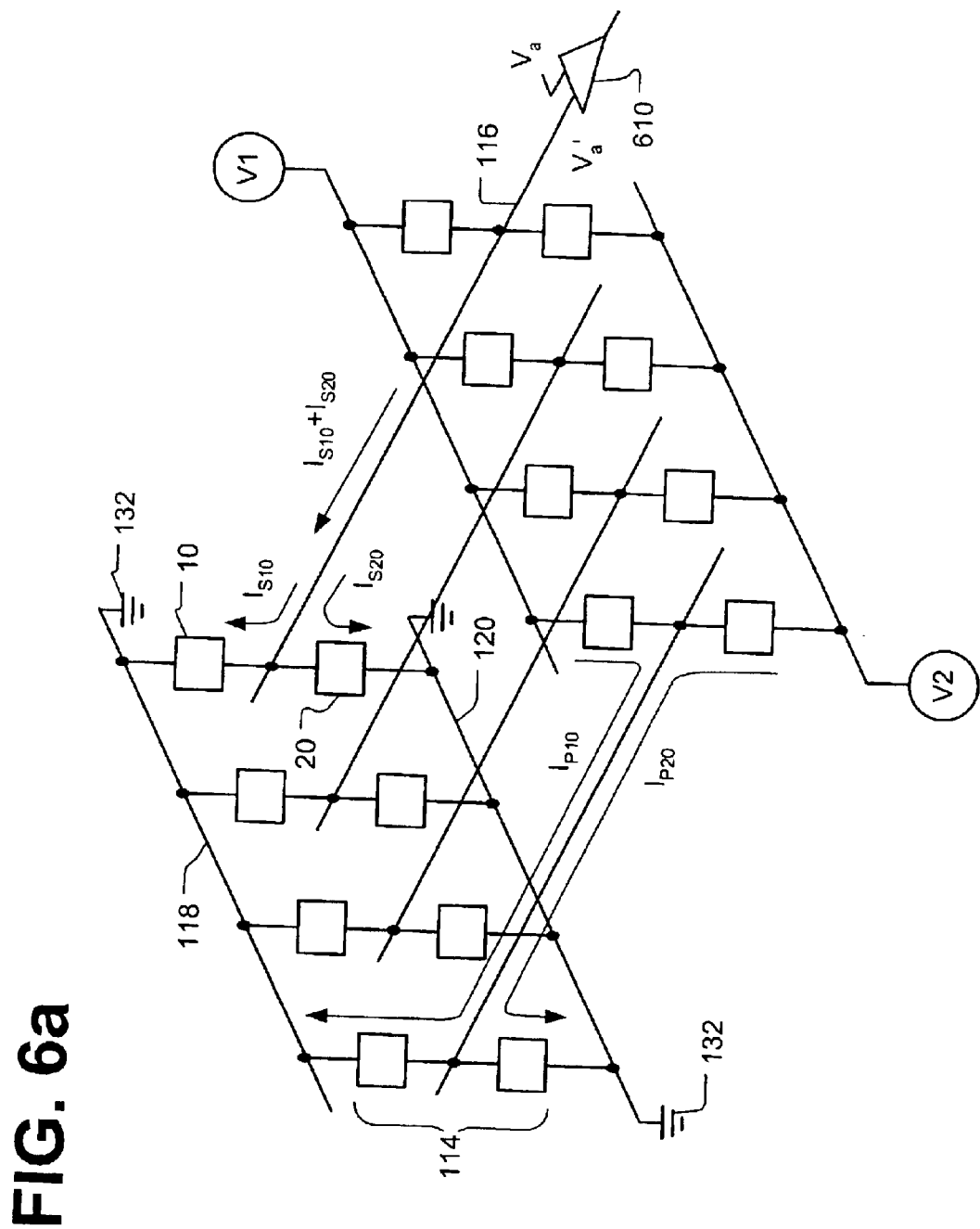
FIGS. 6a and 6b are illustrations of methods for reading an MRAM device according to embodiments of the present invention.

An embodiment of the equipotential method is shown in FIG. 6a. An array voltage ($V_a$) is applied to a first input of a sense amplifier 610, and the selected word line 116 is connected to a second input of the sense amplifier 610. The second input of the sense amplifier 610 couples the voltage ($V_a'$) to the selected word line 116, where $V_a'=V_a$. The selected bit lines 118 and 120 are connected to ground 132. Sense currents ($I_{S10}$, $I_{S20}$) flow through the first and second magnetic tunnel junctions 10 and 20. The sense amplifier 610 determines the resistance state of the selected memory cell 114 by generating an output voltage that is proportional to the total current ($I_{S10}+I_{S20}$) on the word line 116.

To minimize parasitic currents, a voltage V1 is applied to all upper unselected bit lines 118, and a voltage V2 is applied to all lower unselected bit lines 120. All unselected word lines 116 are allowed to float. Parasitic currents ($I_{P10}$ and $I_{P20}$) flow though the junctions 10 and 20 to which the voltages V1 and V2 are applied. The voltages V1 and V2 may be set to the array voltage ($V_a$), whereby V1=V2=$V_a$.

Figure 6B:
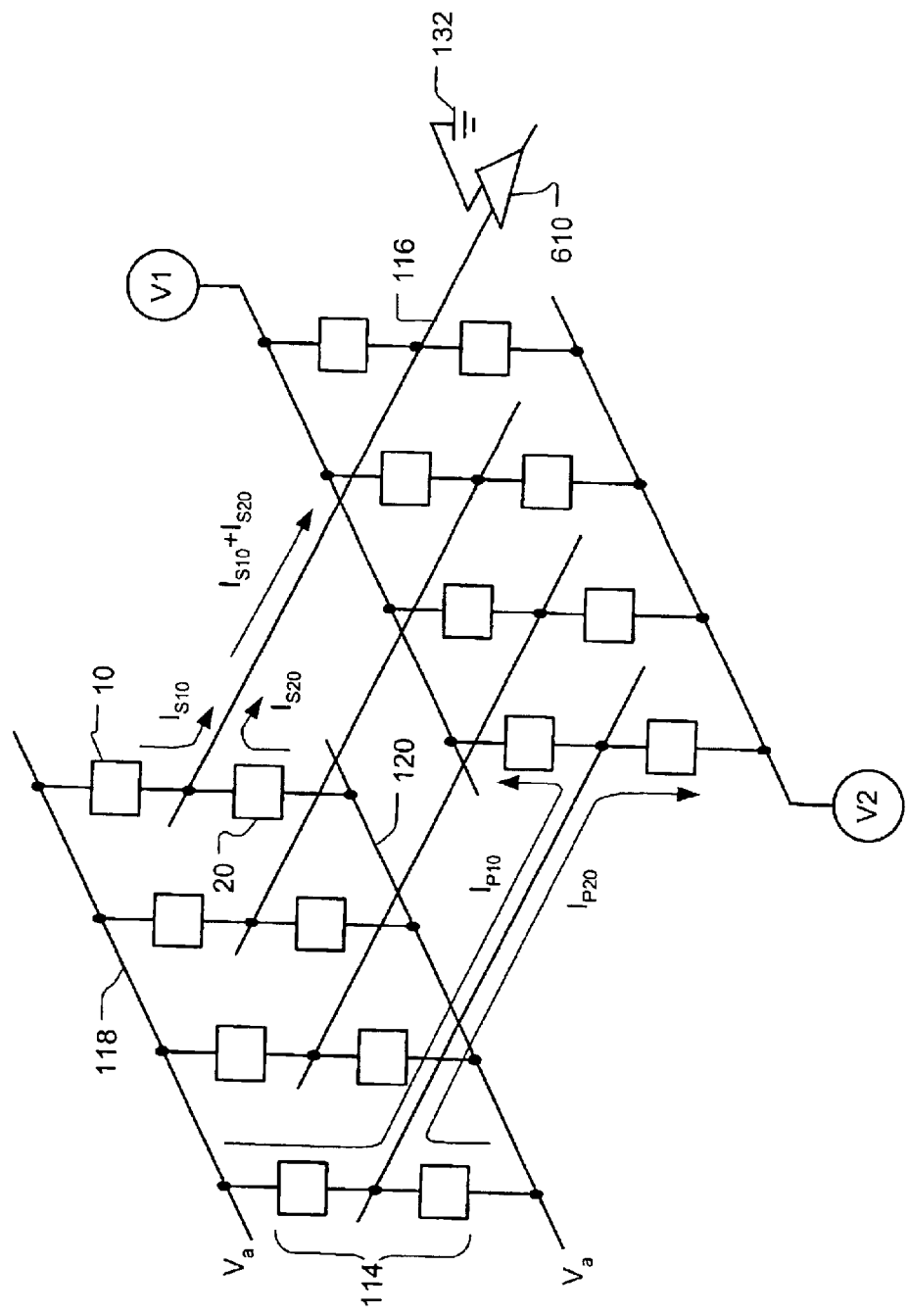

FIG. 6b shows another embodiment of the equipotential method. First and second inputs of a sense amplifier 610 are connected to ground (GND) and a selected word line 116, respectively. The array voltage ($V_a$) is applied to the selected bit lines 118 and 120. A voltage V1 is applied to all upper unselected bit lines 118, and a voltage V2 is applied to all lower unselected bit lines 120. V1=V2=GND. In the alternative, V1=$\epsilon$ and V2=−$\epsilon$, where $\epsilon$ is a small potential of only a few (e.g., tens of) millivolts above ground (GND). Thus, GND<$\epsilon$<<$V_a$. By biasing the upper and lower parts of the array 112 in this manner, the parasitic currents ($I_{P10}$, $I_{P20}$) do not to interfere with the sense currents ($I_{S10}$ and $I_{S20}$).

The MRAM device is not limited to dual-bit memory cells having a shared soft reference layer. The MRAM device may instead include one or more arrays of dual-bit memory cells having hard reference layers.

Figure 7:
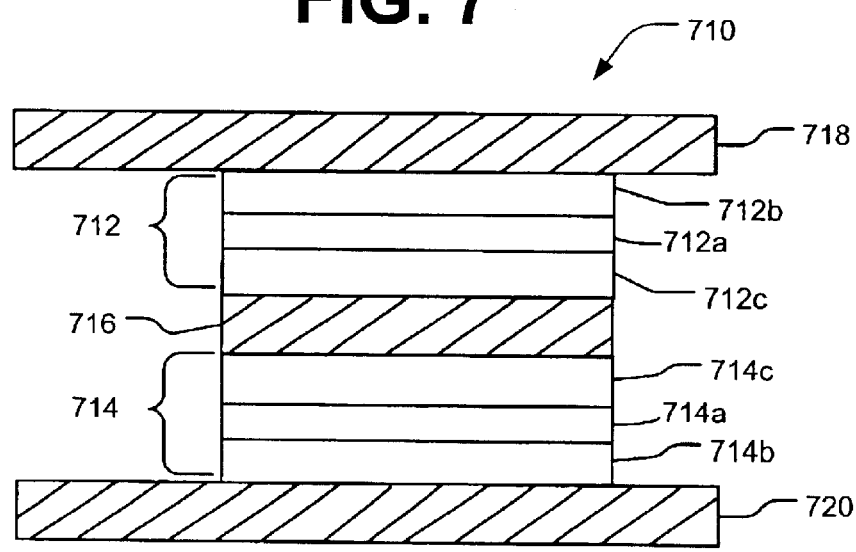
FIG. 7 is an illustration of a magnetic memory device according to a second embodiment of the present invention.

Reference is now made to FIG. 7, which shows a dual bit memory cell 710 of such an array. A first bit 712 of the memory cell 710 includes a spacer layer 712a, a data layer 712b on one side of the spacer layer 712a, and a hard reference layer 712c on the other side of the spacer layer 712a. A second bit 714 includes a spacer layer 714a, a data layer 714b on one side of the spacer layer 714a, and a hard reference layer 714c on the other side of the spacer layer 714a. If the bits 712 and 714 are magnetic tunnel junctions, the spacer layers 712a and 714a are insulating tunnel barriers, and the reference layers 712c and 714c are pinned layers. A pinned layer has a magnetization orientation that is fixed so as not to rotate in the presence of an applied magnetic field in a range of interest. Thus data layer magnetization can be oriented in either of two directions: the same direction as the pinned layer magnetization, or the opposite direction of the pinned layer magnetization.

The magnetization orientation of a pinned layer may be fixed by an antiferromagnetic (AF) pinning layer (not shown). The AF pinning layer provides a large exchange field, which holds the magnetization of the pinned layer in one direction.

A word line 716 is connected to the reference layers 712c and 714c of both bits 712 and 714, a first bit line 718 is connected to the data layer 712 of the first bit 712, and a second bit line 720 is connected to the data layer 714b of the second bit 714. The first bit 712 has two resistance states, and the second bit 714 has two resistance states. The four resistance states are detectably different. An array of such memory cells may be read by the methods illustrated in FIGS. 6a and 6b.

The memory cells are not limited to two bits. Additional bits may be added by adding magnetoresistive devices per memory cell. For example, a memory cell including three magnetoresistive devices would have three bits and eight distinguishable resistance states.

The present invention is not limited to magnetic tunnel junctions. The present invention encompasses other types of magnetoresistive devices, such as giant magnetoresistive (GMR) devices. A GMR device has the same basic configuration as a TMR device, except that data and reference layers are separated by a conductive non-magnetic metallic layer instead of an insulating tunnel barrier. Exemplary spacer layer metals include gold, silver and copper. The relative orientations of the data and reference magnetization vectors affect in-plane resistance of a GMR device. Other types of devices include top and bottom spin valves.

Although several specific embodiments of the present invention have been described and illustrated, the present invention is not limited to the specific forms or arrangements of parts so described and illustrated. Instead, the present invention is construed according to the claims the follow.

What is claimed is:

1. A memory cell comprising serially-connected first and second magnetoresistive devices, the first and second magnetoresistive devices including:
    a conductor clad with ferromagnetic material;
    first and second spacer layers on opposite sides of the clad conductor;
    a first data ferromagnetic layer on the first spacer layer; and
    a second data ferromagnetic layer on the second spacer layer;
    the first magnetoresistive device having first and second resistance states, the second magnetoresistive device having third and fourth resistance states, where all four resistance states are detectably different.

2. The memory cell of claim 1, the spacer layers are insulating tunnel barriers.

3. The memory cell of claim 2, wherein insulating tunnel barriers of the first and second magnetoresistive devices are made of different thickness and/or materials.

4. A method of performing a read operation on the memory cell of claim 2, the method comprising applying a first potential to the first and second data layers, and maintaining the clad conductor at a potential that is lower than the first potential.

5. The method of claim 4, further comprising measuring total current on the clad conductor to determine the resistance states of the memory cell.

6. A data storage device comprising
    an array of memory cells, each memory cell including serially-connected first and second magnetoresistive devices, the first magnetoresistive device of each memory cell having first and second resistance states, the second magnetoresistive device of each memory cell having third and fourth resistance states, all four resistance states of each memory cell being detectably different;
    columns of first conductors, each first conductor connected to data layers of a column of the first magnetoresistive devices;
    columns of second conductors, each second conductor connected to data layers of a column of second magnetoresistive devices; and
    rows of third conductors, each third conductor between reference layers of a row of first and second magnetoresistive devices.

7. The data storage device of claim 6, wherein the first and second magnetoresistive devices of each memory cell include insulating tunnel barriers made of different thickness and/or materials.

8. The data storage device of claim 6, wherein the first and second magnetoresistive devices of each memory cell include:
    a ferromagnetic material clad on the third conductor;
    first and second spacer layers on opposite sides of the clad conductor;
    a first data layer on the first spacer layer; and
    a second data layer on the second spacer layer.

9. The data storage device of claim 8, wherein the spacer layers are insulating tunnel barriers whereby the first data and spacer layers and the clad conductor form a first magnetic tunnel junction, and whereby the second data and spacer layers and the clad conductor form a second magnetic tunnel junction.

10. The data storage device of claim 6, wherein each magnetoresistive device of each memory cell includes a spacer layer, a data ferromagnetic layer on one side of the spacer layer, and a hard reference ferromagnetic layer on the other side of the spacer layer.

11. The data storage device of claim 10, wherein the spacer layers are insulating tunnel barriers and the hard reference layers are pinned layers.

12. The data storage device of claim 6, further comprising a read circuit for applying a first voltage to the first and second conductors crossing a selected memory cell, and maintaining the third conductor crossing the selected memory cell at a second voltage, which is different than the first voltage.

13. The data storage device of claim 12, wherein the read circuit measures total current on the third conductor to determine the resistance states of the first and second magnetoresistive devices.

14. The data storage device of claim 12, wherein the read circuit further applies a third voltage to the first conductors crossing unselected memory cells, and a fourth voltage to the second conductors crossing the unselected memory cells.

15. The data storage device of claim 14, wherein the second, third and fourth voltages are array voltages, and the first voltage is ground.

16. The data storage device of claim 14, wherein the first voltage is an array voltage, and the second, third and fourth voltages are ground.

17. The date storage device of claim 14, wherein the first voltage is an array voltage, the second voltage is ground, the third voltage equals a and the fourth voltage equals -$\epsilon$, where $\epsilon$ is only a few millivolts above ground.

18. The data storage device of claim 12, wherein the read circuit includes a sense amplifier for applying the second voltage to the second conductor crossing the selected memory cell.

19. The data storage device of claim 6, further comprising means for shunting parasitic currents during read operations.

20. A read circuit for a data storage device including an array of memory cells, the read circuit comprising:
    means for applying a first voltage to first and second conductors crossing a selected memory cell;
    means for maintaining a third conductor crossing the selected memory cell at a second voltage, which is different than the first voltage; and
    means for determining the resistance state of the selected memory cell.

21. The read circuit of claim 20, further comprising
    means for applying a third voltage to first conductors crossing unselected memory cells, and a fourth voltage to second conductors crossing the unselected memory cells.

22. The read circuit of claim 21, wherein the second, third and fourth voltages are array voltages, and the first voltage is a reference voltage.

23. The read circuit of claim 21, wherein the first voltage is an array voltage, and the second, third and fourth voltages are a reference voltage.

24. The read circuit of claim 21, wherein the first voltage is an array voltage, the second voltage is ground, the third voltage equals $\epsilon$ and the fourth voltage equals -$\epsilon$, where $\epsilon$ is only a few millivolts above ground.

* * * * *